(12) United States Patent
Kim et al.

(10) Patent No.: US 9,263,703 B2
(45) Date of Patent: Feb. 16, 2016

(54) DISPLAY APPARATUS AND METHOD OF MANUFACTURING THE SAME

(71) Applicant: SAMSUNG DISPLAY CO., LTD., Yongin, Gyeonggi-Do (KR)

(72) Inventors: Hyun-Ho Kim, Yongin (KR); Seung-Yong Song, Yongin (KR); Sang-Hwan Cho, Yongin (KR); Jin-Koo Kang, Yongin (KR); Soo-Youn Kim, Yongin (KR); Seung-Hun Kim, Yongin (KR); Cheol Jang, Yongin (KR); Chung-Sock Choi, Yongin (KR); Sang-Hyun Park, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/270,285

(22) Filed: May 5, 2014

(65) Prior Publication Data

US 2015/0123085 A1 May 7, 2015

(30) Foreign Application Priority Data

Nov. 4, 2013 (KR) ........................ 10-2013-0132997

(51) Int. Cl.
*H01L 51/00* (2006.01)
*H01L 51/52* (2006.01)
*H01L 27/32* (2006.01)

(52) U.S. Cl.
CPC ........ *H01L 51/5284* (2013.01); *H01L 51/5281* (2013.01); *H01L 27/3246* (2013.01); *H01L 51/5256* (2013.01)

(58) Field of Classification Search
CPC ............ H01L 27/3272; H01L 27/3295; H01L 27/3246; H01L 27/3283; H01L 51/0017; H01L 51/56; H01L 51/5281; H01L 51/5284
USPC .................................. 257/40, 59, 72; 438/34
See application file for complete search history.

(56) References Cited

U.S. PATENT DOCUMENTS

| 7,244,669 | B2 | 7/2007 | Sirringhaus et al. |
| 2006/0113529 | A1 | 6/2006 | Lee et al. |
| 2009/0212292 | A1 | 8/2009 | Hayton et al. |
| 2011/0279441 | A1* | 11/2011 | Hayakawa et al. ........... 345/212 |

FOREIGN PATENT DOCUMENTS

| KR | 10-2004-0015717 | 2/2004 |
| KR | 10-2006-0059721 | 6/2006 |
| KR | 10-2006-0115070 | 11/2006 |

(Continued)

OTHER PUBLICATIONS

Cugnet, Cyril et al. *Sensors and Actuators B: Chemical*, ScienceDirect, Elsevier, 2009, pp. 158-163, Elsevier B.V.

(Continued)

*Primary Examiner* — Tu-Tu Ho
(74) *Attorney, Agent, or Firm* — Lewis Roca Rothgerber Christie LLP

(57) ABSTRACT

A display apparatus includes a substrate, a display unit on the substrate and including an emission area and a non-emission area, a first blocking layer at the non-emission area on the display unit, the first blocking layer having a thickness that tapers toward an edge of the first blocking layer, and a second blocking layer on the first blocking layer and configured to block external light reflection.

17 Claims, 8 Drawing Sheets

(56) References Cited

FOREIGN PATENT DOCUMENTS

| | | |
|---|---|---|
| KR | 10-2008-0012332 | 2/2008 |
| KR | 10-2009-0123411 | 12/2009 |
| KR | 10-1114253 | 3/2012 |
| KR | 10-2012-0092907 A | 8/2012 |

OTHER PUBLICATIONS

Utsunomiya, Sumio, et al., *Flexible Color AM-OLED Display Fabricated Using Surface Free Technology by Laser Ablation/Annealing (SUFTLA®) and Ink-jet Printing Technology*, SID 03 DIGEST, 864-867, Technology Platform Research Center, Seiko Epson Corporation, Nagano 399-0293, Japan, (2003).

Ko, et al., *Laser based hybrid inkjet printing of nanoink for flexible electronics*, http://proceedings.spiedigitallibrary.org/, Proc. of SPIE vol. 5713, 97-104 (2005, downloaded May 21, 2013).

Korean Patent Abstract Publication No. 1020110056819 A, dated May 31, 2011, for corresponding Korean Patent 10-1114253 listed above.

* cited by examiner

DISPLAY APPARATUS AND METHOD OF MANUFACTURING THE SAME

CROSS-REFERENCE TO RELATED APPLICATION

This application claims priority to and the benefit of Korean Patent Application No. 10-2013-0132997, filed on Nov. 4, 2013 in the Korean Intellectual Property Office, the disclosure of which is incorporated herein in its entirety by reference.

BACKGROUND

1. Field

Aspects of one or more embodiments of the present invention are directed toward display apparatuses and methods of manufacturing the same.

2. Description of the Related Art

An organic light-emitting display apparatus is a self-luminous display apparatus that displays an image by using (utilizing) organic light-emitting devices (OLEDs) that emit light. The organic light-emitting display apparatus displays an image by using light generated by energy generated when excitons, which are generated by the combination of electrons and holes in an intermediate layer, drop from an excited state to a ground state.

However, when the organic light-emitting display apparatus is used (utilized) in a bright place or location, the black color representation and the contrast thereof become poor due to the reflection of external light.

SUMMARY

Aspects of one or more embodiments of the present invention are directed toward display apparatuses and methods of manufacturing the same.

Additional aspects of embodiments of the present invention will be set forth in part in the description which follows and, in part, will be apparent from the description or may be learned by practice of the presented embodiments.

According to one or more embodiments of the present invention, a display apparatus includes: a substrate; a display unit on the substrate and including an emission area and a non-emission area; a first blocking layer at the non-emission area of the display unit, the first blocking layer having a thickness that tapers (e.g., gradually decreases) toward an edge of the first blocking layer; and a second blocking layer on the first blocking layer and configured to block external light reflection.

The first blocking layer may include a black matrix.

The first blocking layer may have an inclination angle from the edge of the first blocking layer with respect to the substrate.

The second blocking layer may include an alternating stack of one or more dielectric layers and one or more metal layers.

The second blocking layer may include a first dielectric layer, a first metal layer, and a second dielectric layer sequentially stacked at a top portion of the display unit.

The second blocking layer may further include a second metal layer and a third dielectric layer sequentially stacked at a top portion of the second dielectric layer.

The display unit may include a pixel definition layer having an opening portion, and the emission area may correspond to the opening portion.

The display unit may include an organic light-emitting device on the substrate.

The organic light-emitting device may include a first electrode, an intermediate layer, and a second electrode, the display unit may further include a pixel definition layer having an opening portion, and the intermediate layer may be at the opening portion.

The display apparatus may further include an encapsulation layer directly on the display unit.

According to one or more embodiments of the present invention, a method of manufacturing a display apparatus includes: forming a display unit including an emission area and a non-emission area, on a substrate; forming a first blocking material on the display unit; forming a first blocking layer at the non-emission area by removing the first blocking material at the emission area; and forming a second blocking layer on the first blocking layer.

The first blocking material at the emission area may be removed by a laser beam.

The laser beam may be a Gaussian laser beam.

The first blocking material may include a black matrix.

A thickness of the first blocking layer may taper (e.g., gradually decrease) toward an edge of the first blocking layer.

The first blocking layer may have an inclination angle from the edge of the first blocking layer with respect to the substrate.

The forming of the display unit may include forming an organic light-emitting device on the substrate.

The forming of the display unit may include forming a pixel definition layer having an opening portion, and the emission area may correspond to the opening portion.

The forming of the second blocking layer may include alternately stacking one or more dielectric layers and one or more metal layers.

The method of manufacturing the display apparatus may further include forming an encapsulation layer directly on the display unit before the forming of the first blocking material.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
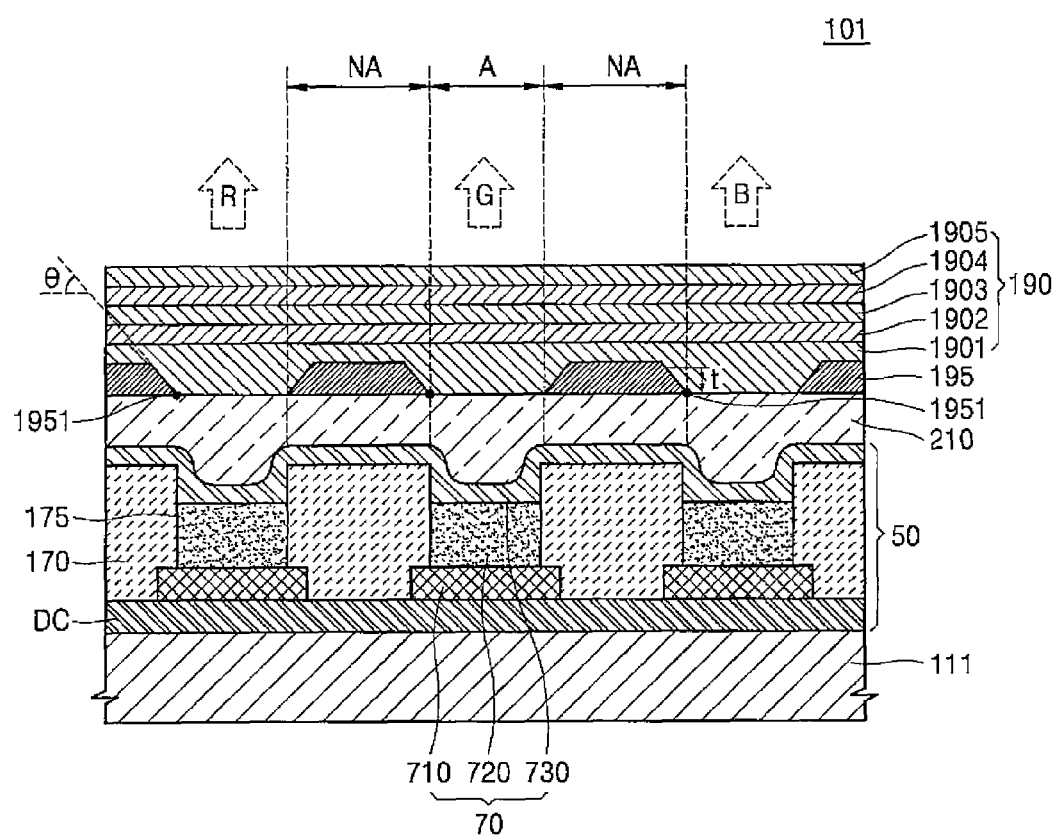
FIG. 1 is a partial cross-sectional view of a display apparatus according to an embodiment of the present invention.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, expressions such as "at least one of," when preceding a list of elements, modify the entire list of elements and do not modify the individual elements of the list.

The present invention may include various embodiments and modifications, and example embodiments thereof are illustrated in the drawings and will be described herein in detail. The effects and features of the present invention and the accomplishing method thereof will become more apparent from the following description of the embodiments, taken in conjunction with the accompanying drawings. However, the present invention is not limited to the embodiments described below, and may be embodied in various modes and/or forms.

Hereinafter, embodiments of the present invention will be described in more detail with reference to the accompanying drawings. In the following description, like reference numerals denote like elements, and a redundant description thereof may be omitted.

It will be understood that although the terms "first", "second", etc. may be used herein to describe various components, these components should not be limited by these terms. These terms are only used to distinguish one component from another.

As used herein, the singular forms "a", "an", and "the" are intended to include the plural forms as well, unless the context clearly indicates otherwise.

It will be further understood that the terms "comprise", "include", and "have" used herein specify the presence of stated features or components, but do not preclude the presence or addition of one or more other features or components.

It will be understood that when a layer, region, or component is referred to as being "formed on" another layer, region, or component, it may be directly or indirectly formed on the other layer, region, or component. That is, for example, one or more intervening layers, regions, or components may also be present.

Sizes of components in the drawings may be exaggerated for convenience of description. In other words, because sizes and thicknesses of components in the drawings are arbitrarily illustrated for convenience of description, the following embodiments are not limited thereto. Further, the use of "may" when describing embodiments of the present invention refers to "one or more embodiments of the present invention."

Hereinafter, example embodiments of the present invention will be described in detail with reference to the accompanying drawings.

FIG. 1 is a partial cross-sectional view of a display apparatus 101 according to an embodiment of the present invention.

As illustrated in FIG. 1, the display apparatus 101 may include a substrate 111, a display unit 50, a first blocking layer 195, and a second blocking layer 190. The display unit 50 may include an organic light-emitting device (OLED) 70 and a driving circuit DC.

The substrate 111 may be an insulating substrate formed of, for example, glass, quartz, or ceramics, or may be a flexible substrate formed of, for example, plastics. Also, the substrate 111 may be a metal substrate formed of, for example, stainless steel.

The driving circuit DC is formed on the substrate 111. The driving circuit DC includes thin film transistors (TFTs) 10 and 20 (see FIG. 2) and a capacitor 80 (see FIG. 2). The driving circuit DC drives the OLED 70. That is, the OLED 70 displays an image by emitting light according to a driving signal received from the driving circuit DC.

Figure 2:
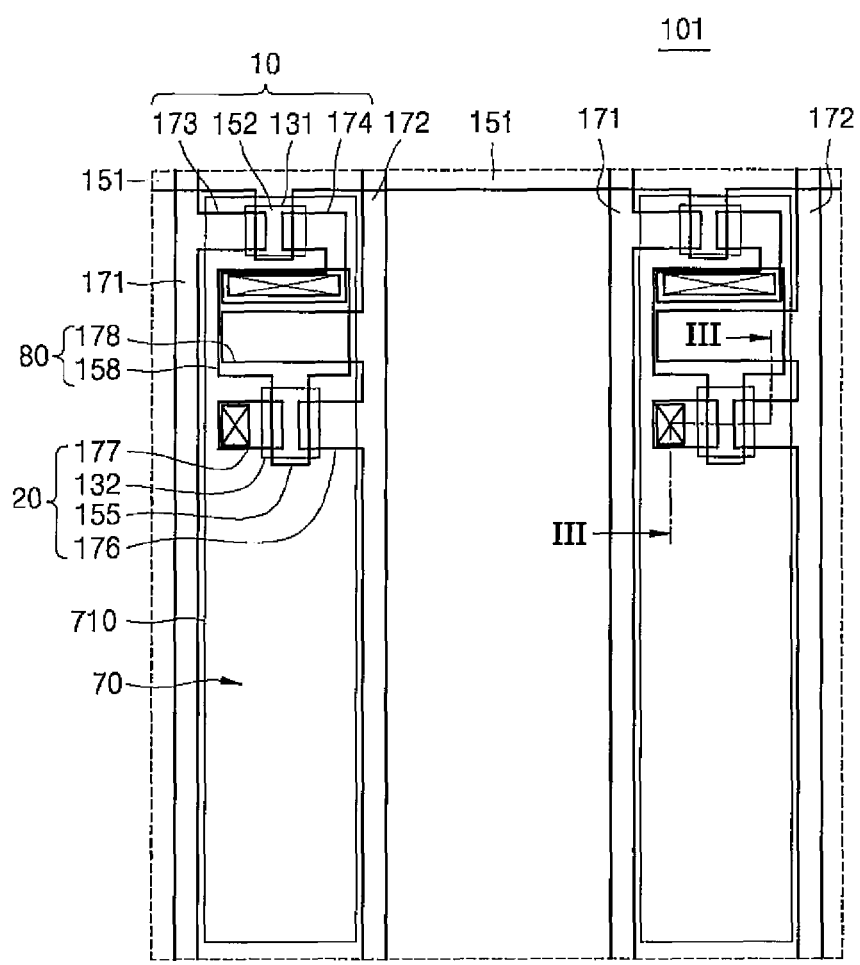
FIG. 2 is a configuration diagram illustrating a pixel circuit of the display apparatus shown in FIG. 1.
Figure 3:
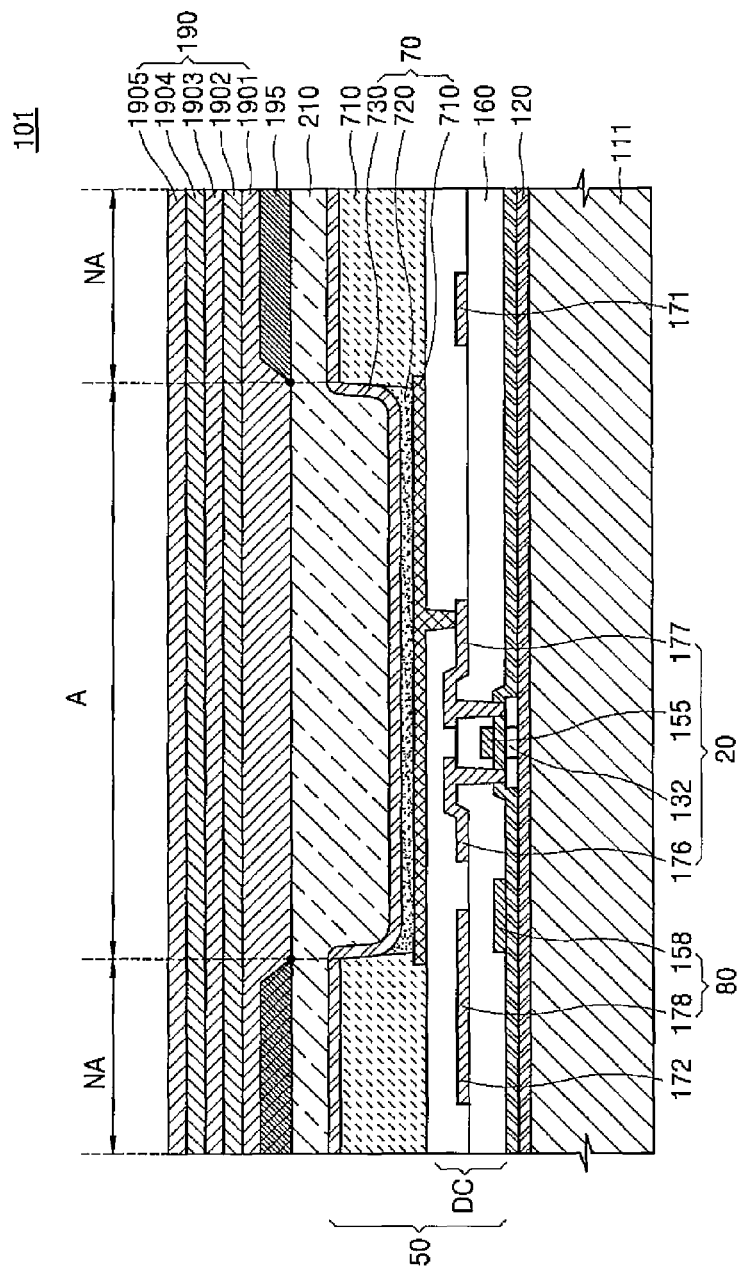
FIG. 3 is a cross-sectional view taken along the line III-III of FIG. 2.

A detailed structure of the driving circuit DC is illustrated in FIGS. 2 and 3, but the driving circuit DC is not limited to the structure illustrated in FIGS. 2 and 3. The driving circuit DC may be formed having various structures within the scope of the present invention, and the example embodiments may be easily modified by those of ordinary skill in the art without departing from the scope of the present invention.

The OLED 70 includes a first electrode 710, an intermediate layer 720, and a second electrode 730. The first electrode 710 is an anode electrode, that is, a hole injection electrode, and the second electrode 730 is a cathode electrode, that is, an electron injection electrode. However, embodiments of the present invention are not limited thereto. That is, the first electrode 710 may be a cathode electrode, and the second electrode 730 may be an anode electrode.

The intermediate layer 720 includes an organic emission layer. As another example, the intermediate layer 720 includes an organic emission layer and may further include at least one of a hole injection layer (HIL), a hole transport layer (HTL), an electron transport layer (ETL), and an electron injection layer (EIL). However, the present embodiment is not limited thereto, and the intermediate layer 720 includes an organic emission layer and may further include other various functional layers.

The display apparatus 101 may further include a pixel definition layer 170 having an opening portion 175 that exposes at least a portion of the first electrode 710. The intermediate layer 720 may emit light at or through the opening portion 175 of the pixel definition layer 170. That is, the opening portion 175 of the pixel definition layer 170 may define an emission area A where light is actually emitted. The emission area A may be an area at which the opening portion 175 of the pixel definition layer 170 is formed. A non-emission area NA may be the remaining area other than the emission area A, that is, the area at which the pixel definition layer 170 is formed.

An encapsulation layer 210 is disposed to face the substrate 111 and cover the OLED 70 and the driving circuit DC. The encapsulation layer 210 may include a plurality of inorganic layers or may include an inorganic layer and an organic layer.

The organic layer of the encapsulation layer 210 is formed of a polymer and may be a single layer or a layer stack formed of polyethylene terephthalate, polyimide, polycarbonate, an epoxy, polyethylene, and/or polyacrylate. The organic layer may be formed of polyacrylate, and for example, may include a polymerized monomer composition including a diacrylate-based monomer and a triacrylate-based monomer. The monomer composition may further include a monoacrylate-based monomer. Also, the monomer composition may further include a photoinitiator, such as trimethylbenzoyl-diphenyl-phosphineoxide (TPO), but embodiments of the present invention are not limited thereto.

The inorganic layer of the encapsulation layer 210 may be a single layer or a layer stack including a metal oxide and/or a metal nitride. For example, the inorganic layer may include any one of silicon nitride ($SiN_x$), aluminum oxide ($Al_2O_3$), silicon oxide ($SiO_2$), and/or titanium oxide ($TiO_2$).

A top layer of the encapsulation layer 210, which is exposed to the outside, may be formed as an inorganic layer in order to prevent or reduce the permeation of moisture into the OLED 70.

The encapsulation layer 210 may include at least one sandwich structure in which at least one organic layer is between at least two inorganic layers. As another example, the encapsulation layer 210 may include at least one sandwich structure in which at least one inorganic layer is between at least two organic layers. As another example, the encapsulation layer 210 may include a sandwich structure in which at least one organic layer is between at least two inorganic layers and a sandwich structure in which at least one inorganic layer is between at least two organic layers.

The encapsulation layer 210 may include a first inorganic layer, a first organic layer, and a second inorganic layer that are sequentially formed from (e.g., stacked at) a top portion of the OLED 70.

As another example, the encapsulation layer 210 may include a first inorganic layer, a first organic layer, a second inorganic layer, a second organic layer, and a third inorganic layer that are sequentially formed from (e.g., stacked at) the top portion of the OLED 70.

As another example, the encapsulation layer 210 may include a first inorganic layer, a first organic layer, a second inorganic layer, a second organic layer, a third inorganic layer, a third organic layer, and a fourth inorganic layer that are sequentially formed from (e.g., stacked at) the top portion of the OLED 70.

A halogenized metal layer including lithium fluoride (LiF) may be additionally included between the OLED 70 and the first inorganic layer. The halogenized metal layer may prevent the OLED 70 from being damaged when the first inorganic layer is formed by sputtering or plasma deposition.

The first organic layer may be smaller (e.g., thinner or have a smaller surface area) than the second inorganic layer, and the second organic layer may be smaller (e.g., have a smaller surface area) than the third inorganic layer.

As another example, the first organic layer may be completely covered by the second inorganic layer, and the second organic layer may be completely covered by the third inorganic layer.

The first blocking layer 195 may be formed on or above the display unit 50. The first blocking layer 195 may be formed at (e.g., in) the non-emission area NA. The first blocking layer 195 may be formed on or above the encapsulation layer 210. The first blocking layer 195 may be formed of a black matrix. The first blocking layer 195 may be patterned to maintain the permeation of the emission area A and to significantly reduce the external light reflection of the non-emission area NA, thereby improving the visibility thereof.

A thickness t of the first blocking layer 195 may taper (e.g., gradually decrease) toward an edge 1951 thereof. The first blocking layer 195 may have an inclination angle θ with respect to the substrate 111 from the edge 1951. The inclination angle θ may be greater than about 0° and less than about 90°. Because the side of the first blocking layer 195 is inclined, a portion at which light emitted from each emission area A is interfered by the first blocking layer 195 may be reduced, and thus, a wide viewing angle thereof may be improved. Because the thickness t of the first blocking layer 195 tapers (e.g., gradually decreases) toward the edge 1951, an effective emission area of the intermediate layer 720 depending on an emission angle may be increased, and thus, the wide viewing angle may be improved.

The second blocking layer 190 may be formed on the first blocking layer 195. The second blocking layer 190 may cover the first blocking layer 195. The second blocking layer 190 may be formed by an alternate stack (e.g., an alternating stack) of one or more dielectric layers and one or more metal layers.

The second blocking layer 190 may include a first dielectric layer 1901, a first metal layer 1902, a second dielectric layer 1903, a second metal layer 1904, and a third dielectric layer 1905 that are sequentially formed from (e.g., stacked from) the top portion of the display unit 50. Because the second blocking layer 190 is formed to have a metal-dielectric multilayer structure, a thickness of the second blocking layer 190 may be less than that of a polarizer and external light reflection may be blocked by the destructive interference of light.

Hereinafter, the internal structure of the display apparatus 101 will be described in detail with reference to FIGS. 2 and 3. FIG. 2 is a configuration diagram illustrating a structure of a pixel of the display apparatus 101 shown in FIG. 1. FIG. 3 is a cross-sectional view taken along the line III-III of FIG. 2. Herein, the pixel is a minimum image display unit of the display apparatus 101.

A unit pixel includes a plurality of sub-pixels that may emit light of various colors. For example, the sub-pixels may include sub-pixels that emit red color light, green color light, and/or blue color light or sub-pixels that emit red color light, green color light, and/or blue color light, and/or white light.

The sub-pixels may include intermediate layers 720 having organic emission layers that emit lights of various colors. For example, the sub-pixels include intermediate layers 720 having organic emission layers that emit red color light, green color light, and/or blue color light.

As another example, the sub-pixels emitting lights of various colors may include intermediate layers that emit lights of the same color, for example, white, and may include a color converting layer or a color filter that coverts the white light into a color light (e.g., light of a predetermined color).

The intermediate layer emitting the white color light (or white light) may have a variety of structures, for example, a structure in which at least a light-emitting material emitting red color light, a light-emitting material emitting green color light, and a light-emitting material emitting blue color light are stacked on one another.

As another example for emitting the white light, the intermediate layer may include a structure in which at least a light-emitting material emitting red color light, a light-emitting material emitting green color light, and a light-emitting material emitting blue color light are mixed.

The red, greed, and blue colors are an example and the present embodiment is not limited thereto. In other words, any combination of other various colors, which is capable of emitting white light, may be employed in addition to a combination of red, green, and blue colors.

FIGS. 2 and 3 illustrate a 2Tr-1 Cap active matrix (AM) display apparatus 101 including two thin film transistors (TFTs) 10 and 20 and one capacitor 80 in each pixel; however, embodiments of the present invention are not limited thereto. Therefore, the display apparatus 101 may include three or more TFTs and two or more capacitors in each pixel, and may be formed to have various structures with separate, additional wires formed therein. Herein, the pixel is a minimum image display unit that is disposed in each pixel region. The display apparatus 101 displays an image utilizing a plurality of pixels.

As illustrated in FIGS. 2 and 3, the display apparatus 101 includes a switching TFT 10, a driving TFT 20, a capacitor 80, and an OLED 70 that are formed in each pixel. Herein, a configuration including the switching TFT 10, the driving TFT 20, and the capacitor 80 is referred to as a driving circuit DC. Also, the display apparatus 101 further includes: a gate line 151 that is disposed along (e.g., extends along) one direction; a data line 171 that is insulated from and intersects (e.g., crosses) the gate line 151; and a common power line 172.

Each pixel may be defined by a boundary between the gate line 151, the data line 171, and the common power line 172, but is not limited thereto.

As described above, the OLED 70 includes a first electrode 710, an intermediate layer 720 formed on the first electrode 710, and a second electrode 730 formed on the intermediate layer 720. Holes and electrons are respectively injected from the first electrode 710 and the second electrode 730 into the intermediate layer 720. Light is emitted when excitons, generated by the combination of the holes and the electrons in the intermediate layer 720, drop from an excited state to a ground state.

The capacitor 80 includes a pair of capacitor plates 158 and 178 that are disposed with an interlayer insulating layer 160 therebetween. Herein, the interlayer insulating layer 160 includes a dielectric material. The capacitance of the capacitor 80 is determined by the amount of charge stored in the capacitor 80 and the voltage between the capacitors 158 and 178.

The switching TFT 10 includes a switching semiconductor layer 131, a switching gate electrode 152, a switching source electrode 173, and a switching drain electrode 174. The driving TFT 20 includes a driving semiconductor layer 132, a driving gate electrode 155, a driving source electrode 176, and a driving drain electrode 177. The switching semiconductor layer 131 and the driving semiconductor layer 132 may include various suitable materials. For example, the switching semiconductor layer 131 and the driving semiconductor layer 132 may include an inorganic semiconductor material such as amorphous silicon or crystalline silicon. As another example, the switching semiconductor layer 131 and the driving semiconductor layer 132 may include a semiconductor oxide. As another example, the switching semiconductor layer 131 and the driving semiconductor layer 132 may include an organic semiconductor material.

The switching TFT 10 acts as a switching device to select a pixel to emit light. The switching gate electrode 152 is coupled to (e.g., connected to) the gate line 151. The switching source electrode 173 is coupled to (e.g., connected to) the data line 171. The switching drain electrode 174 is spaced from (e.g., spaced apart from) the switching source electrode 173 and is coupled to (e.g., connected to) the capacitor plate 158.

The driving TFT 20 applies a driving power voltage to the first electrode 710 so that the intermediate layer 720 of the OLED 70 of a selected pixel emits light. The driving gate electrode 155 is coupled to (e.g., connected to or integrally provided with) the capacitor plate 158 and coupled to (e.g., connected to or integrally provided with) the switching drain electrode 174. The driving source electrode 176 and the capacitor plate 178 are coupled to (e.g., connected to) the common power line 172. The driving drain electrode 177 is coupled to (e.g., connected to) the first electrode 710 of the OLED 70 through a contact opening (e.g., a contact hole).

By this structure, the switching TFT 10 is driven by a gate voltage, which is applied to the gate line 151, to transmit a data voltage, which is applied to the data line 171, to the driving TFT 20. A voltage corresponding to a difference between a common voltage applied by the common power line 172 to the driving TFT 20 and the data voltage received from the switching TFT 10 is stored in the capacitor 80, and a current corresponding to the voltage stored in the capacitor 80 flows through the driving TFT 20 into the OLED 70, so that the OLED 70 emits light.

A buffer layer 120 may be formed directly on the substrate 111.

Although only the case where the display unit 50 includes the OLED 70 has been described above, embodiments of the present invention are not limited thereto. That is, the inventive concept may also be applied to a display apparatus including various types of display units 50, for example, a display unit 50 including a liquid crystal device.

Figure 4:
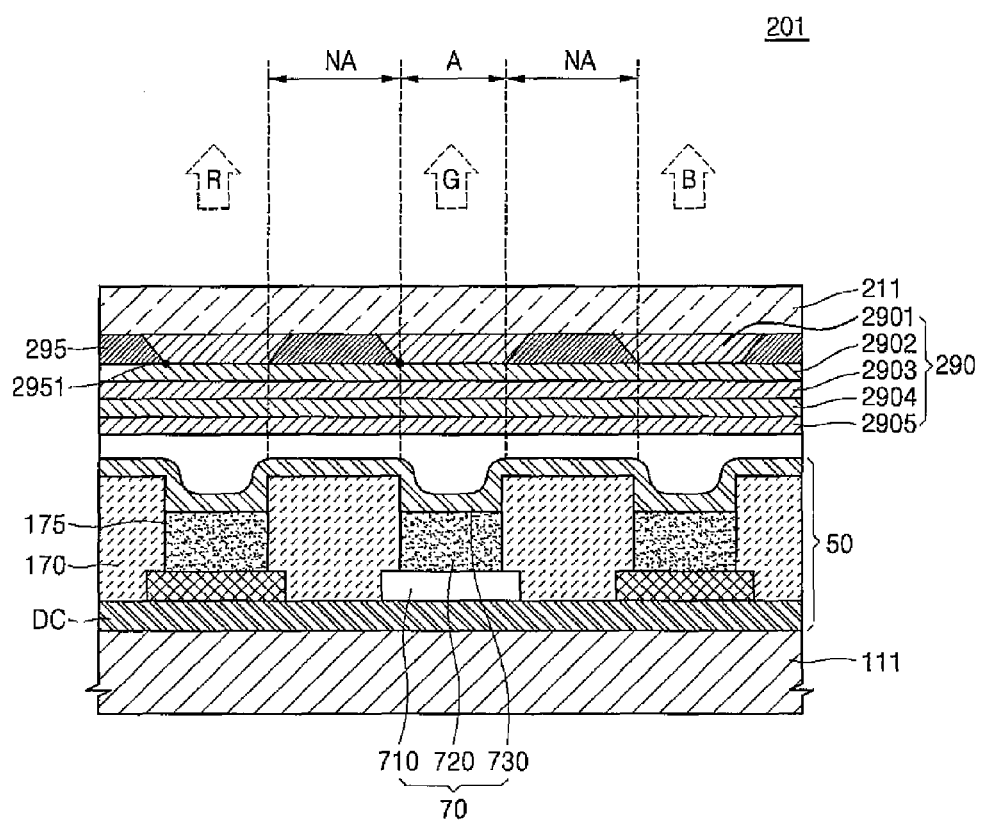
FIG. 4 is a partial cross-sectional view of a display apparatus according to another embodiment of the present invention.

FIG. 4 is a partial cross-sectional view of a display apparatus 201 according to another embodiment of the present invention.

Hereinafter, the present embodiment will be described primarily focusing on differences from the embodiment shown in FIG. 1. Herein, like reference numerals denote like elements throughout FIGS. 1 to 4.

As illustrated in FIG. 4, the display apparatus 201 may include a substrate 111, a display unit 50, a first blocking layer 295, a second blocking layer 290, and an encapsulation substrate 211.

The display apparatus 201 according to the present embodiment is different from the display apparatus 101 according to the embodiment shown in FIG. 1 in that the first blocking layer 295 and the second blocking layer 290 are applied to the encapsulation substrate 211. The present embodiment may be applied to a rigid display or a large-sized display in which an expensive polarizer is difficult or uneconomical to use.

A thickness of the first blocking layer 295 may taper (e.g., gradually decrease) toward an edge 2951 thereof. The first blocking layer 295 may have an inclination angle with respect to the substrate 111 from the edge 2951. The inclination angle may be greater than about 0° and less than about 90°. Because the side of the first blocking layer 295 is inclined, a portion at which light emitted from each emission area A is interfered by the first blocking layer 295 may be reduced, and thus, a wide viewing angle thereof may be improved. Because the thickness of the first blocking layer 295 tapers (e.g., gradually decreases) toward the edge 2951, an effective emission area of the intermediate layer 720 depending on an emission angle may be increased, and thus, the wide viewing angle may be improved.

The second blocking layer 290 may be formed by an alternating stack of one or more dielectric layers and one or more metal layers. The second blocking layer 290 may include a first dielectric layer 2901, a first metal layer 2902, a second dielectric layer 2903, a second metal layer 2904, and a third dielectric layer 2905 that are sequentially formed from (e.g., stacked at) a bottom portion of the encapsulation substrate 211.

FIGS. 5A to 5D are schematic cross-sectional views illustrating a method of manufacturing the display apparatus 101 shown in FIG. 1, according to an embodiment of the present invention.

Figure 5A:
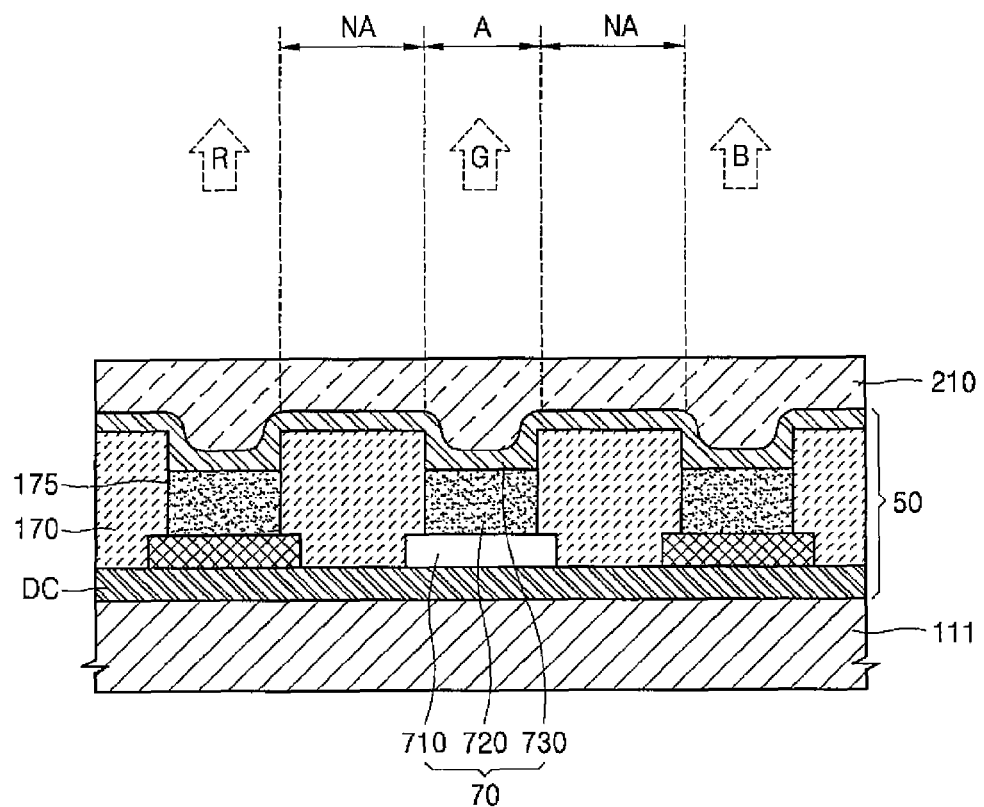
FIGS. 5A to 5D are schematic cross-sectional views illustrating a method of manufacturing the display apparatus shown in FIG. 1, according to an embodiment of the present invention.

As illustrated in FIG. 5A, a display unit 50 including an emission area A and a non-emission area NA is formed on a substrate 111. Thereafter, an encapsulation layer 210 is formed on the display unit 50.

Figure 5B:
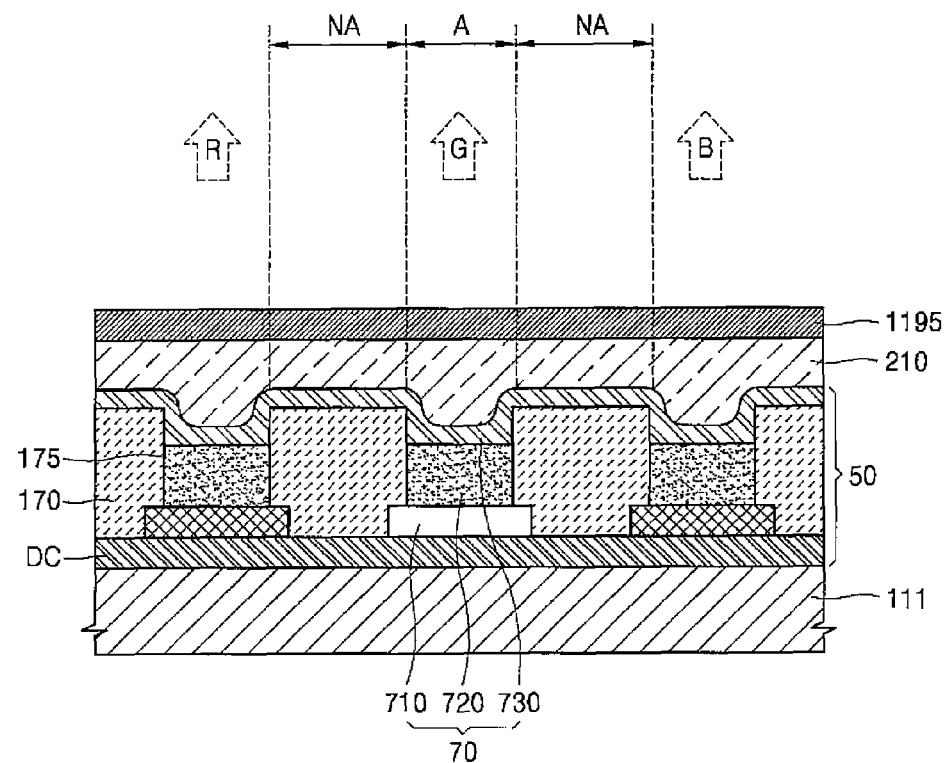

Thereafter, as illustrated in FIG. 5B, a first blocking material 1195 is formed on the encapsulation layer 210. The first blocking material 1195 may include a black matrix. The first blocking material 1195 may be formed on the encapsulation layer 210. The first blocking material 1195 may be formed by screen printing, slit coating, and/or spin coating.

Figure 5C:
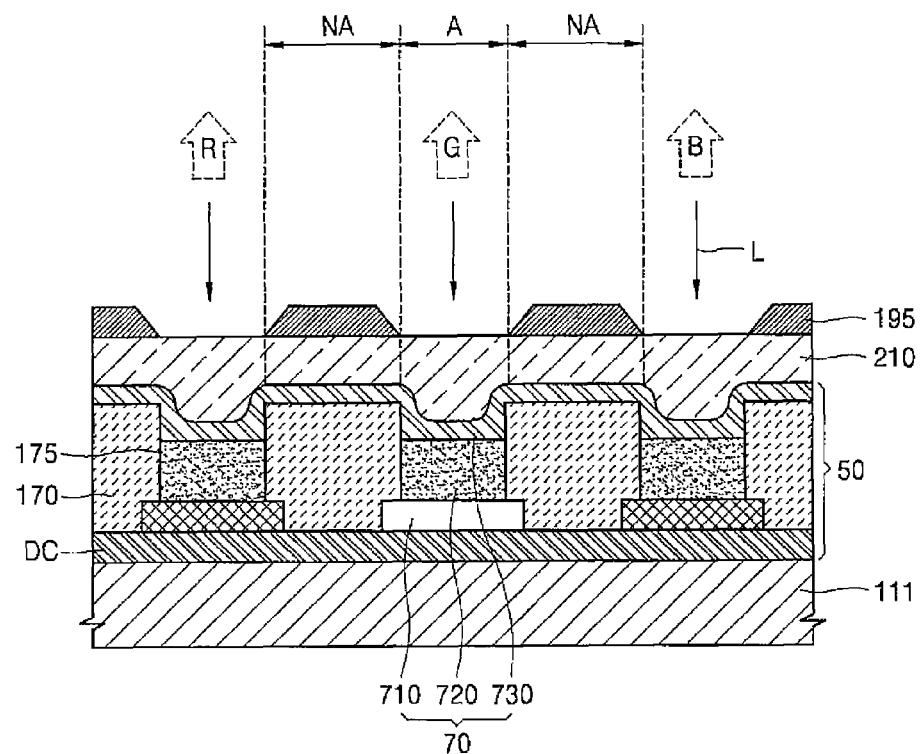

Thereafter, as illustrated in FIG. 5C, the first blocking material 1195 formed at the emission area A is removed to form a first blocking layer 195 at the non-emission area A.

The first blocking material 1195 formed at the emission area A may be removed by, for example, a laser beam L. The laser beam L may be a femto-second laser beam, a pico-second laser beam, a nano-second laser beam, or a micro-second laser beam. Because the first blocking material 1195 is removed by the laser beam L, a high-temperature wet etching process is unnecessary, and thus, the first blocking layer 195 may be patterned while reducing damage to a device. Because the first blocking material 1195 is removed by the laser beam L, a process of patterning the first blocking material 195 may be simpler than a photolithography-based patterning process.

The laser beam L may be a Gaussian laser beam. A laser source is used in a laser removing equipment. In this case, when a filtered laser beam having a suitable beam radius and a suitable distance to a propagation axis is used with consideration of the line width and the area of first blocking material 1195 at the emission area A to be removed, the first blocking material 1195 may be removed in the form of (that is, removed so as to form) an inverted pyramid shape (from the source of the laser beam L). A thickness of the first blocking layer 195 patterned by the laser beam L may taper (e.g., gradually decrease) toward an edge thereof. The first blocking layer 195 may have an inclination angle with respect to the substrate 111 from the edge. The inclination angle may be greater than about 0° and less than about 90°. Because the side of the first blocking layer 195 is inclined, a portion at which light emitted from each emission area A is interfered by the first blocking layer 195 may be reduced, and thus, a wide viewing angle thereof may be improved. Because the thickness of the first blocking layer 195 tapers (e.g., gradually decreases) toward the edge, an effective emission area of the intermediate layer 720 depending on an emission angle may be increased, and thus, the wide viewing angle may be improved.

Figure 5D:
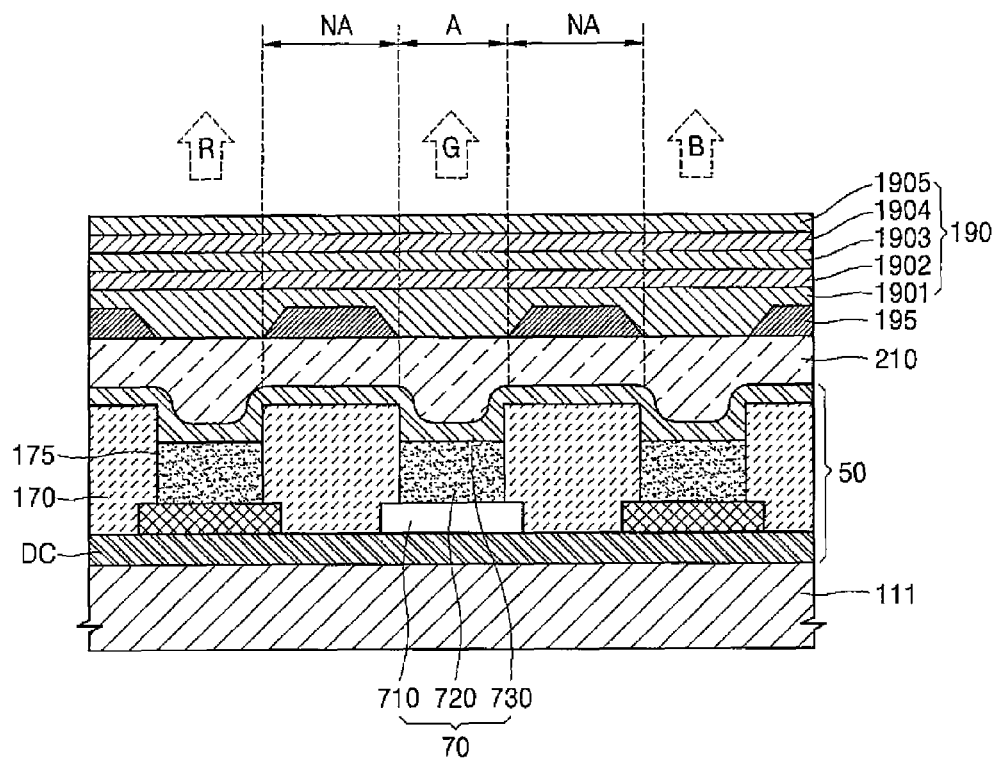

Thereafter, as illustrated in FIG. 5D, a second blocking material 190 is formed on the first blocking layer 195. The second blocking layer 190 may be formed by alternately stacking one or more dielectric layers and one or more metal layers. The second blocking layer 190 may include a first dielectric layer 1901, a first metal layer 1902, a second dielectric layer 1903, a second metal layer 1904, and a third dielectric layer 1905 that are sequentially formed from (or stacked at) the top portion of the display unit 50.

As described above, according to the one or more of the above embodiments of the present invention, because the external light reflection of the display apparatuses may be reduced, the visibility thereof may be improved.

It should be understood that the example embodiments described herein should be considered in a descriptive sense only and not for purposes of limitation. Descriptions of features or aspects within each embodiment should typically be considered as available for other similar features or aspects in other embodiments.

White one or more embodiments of the present invention have been described herein with reference to the figures, it will be understood by those of ordinary skill in the art that various changes in form and details may be made therein without departing from the spirit and scope of the present invention as defined by the following claims and their equivalents.

What is claimed is:

1. A display apparatus comprising:
   a substrate;
   a display unit on the substrate and comprising a pixel defining layer having an opening therein, the display unit having an emission area and a non-emission area, the emission area corresponding to the opening in the pixel defining layer;
   a first blocking layer at the non-emission area of the display unit, the first blocking layer having a thickness that tapers toward an edge of the first blocking layer; and
   a second blocking layer on the first blocking layer and configured to block external light reflection.

2. The display apparatus of claim 1, wherein the first blocking layer comprises a black matrix.

3. The display apparatus of claim 1, wherein the first blocking layer has an inclination angle at the edge of the first blocking layer with respect to the substrate.

4. The display apparatus of claim 1, wherein the second blocking layer comprises a first dielectric layer, a first metal layer, and a second dielectric layer sequentially stacked at a top portion of the display unit.

5. The display apparatus of claim 4, wherein the second blocking layer further comprises a second metal layer and a third dielectric layer sequentially stacked at a top portion of the second dielectric layer.

6. The display apparatus of claim 1, wherein the display unit comprises an organic light-emitting device on the substrate.

7. The display apparatus of claim 6, wherein
   the organic light-emitting device comprises a first electrode, an intermediate layer, and a second electrode, and
   the intermediate layer is at the opening.

8. The display apparatus of claim 1, further comprising an encapsulation layer directly on the display unit.

9. A display apparatus of claim 1, comprising:
   a substrate;
   a display unit on the substrate and comprising an emission area and a non-emission area;
   a first blocking layer at the non-emission area of the display unit, the first blocking layer having a thickness that tapers toward an edge of the first blocking layer; and
   a second blocking layer on the first blocking layer and configured to block external light reflection, the second blocking layer comprising an alternating stack of one or more dielectric layers and one or more metal layers.

10. A method of manufacturing a display apparatus, the method comprising:
    forming a display unit comprising a pixel defining layer having an opening therein, the display unit having an emission area and a non-emission area, the emission area corresponding to the opening in the pixel defining layer, on a substrate;
    forming a first blocking material on the display unit;
    forming a first blocking layer at the non-emission area by removing the first blocking material at the emission area such that the first blocking layer has a thickness that tapers toward an edge of the first blocking layer; and
    forming a second blocking layer on the first blocking layer, the second blocking layer being configured to block external light reflection.

11. The method of claim 10, wherein the first blocking material at the emission area is removed by a laser beam.

12. The method of claim 11, wherein the laser beam is a Gaussian laser beam.

13. The method of claim 10, wherein the first blocking material comprises a black matrix.

14. The method of claim 10, wherein the first blocking layer has an inclination angle from the edge of the first blocking layer with respect to the substrate.

15. The method of claim 10, wherein the forming of the display unit comprises forming an organic light-emitting device on the substrate.

16. The method of claim 10, wherein the forming of the second blocking layer comprising alternately stacking one or more dielectric layers and one or more metal layers.

17. The method of claim 10, further comprising forming an encapsulation layer directly on the display unit before the forming of the first blocking material.

* * * * *